Jan. 12, 1965 J. P. STELMAK ETAL 3,165,708

MONOLITHIC SEMICONDUCTOR OSCILLATOR

Filed April 28, 1961

United States Patent Office 3,165,708

Patented Jan. 12, 1965

3,165,708

MONOLITHIC SEMICONDUCTOR OSCILLATOR

John P. Stelmak and John D. Husher, Greensburg, Pa., assignors to Westinghouse Electric Corporation, East Pittsburgh, Pa., a corporation of Pennsylvania Filed Apr. 28, 1961, Ser. No. 106,240
3 Claims. (Cl. 331—108)

This invention relates to semiconductor devices which provide within a unitary semiconductor body the electronic functions of a plurality of electronic components. More particularly, the present invention relates to such monolithic devices which are suitable, upon application of bias potential thereto, for use as an oscillator.

As is well known, the need is great for highly complex electronic devices and systems whose reliability must be high and whose size and weight must be small. One general field of endeavor directed to meeting this need is that which has become known as molecular electronics wherein the object is to provide a function from a single semiconductor device which can be obtained only from several devices which must be separately interconnected by external leads in combination if older and more conventional techniques are employed. For example, circuit combinations of transistors, diodes, capacitors and resistors require numerous soldered connections which are susceptible to failure and further provide an undesirably bulky device. Among the types of circuits whose function it is desirable to obtain from a single device are oscillator circuits.

It is, therefore, an object of this invention to provide a monolithnic semiconductor device capable of performing the function of an oscillator circuit.

Another object is to provide the functional equivalent of a tunable oscillator in a monolithic device having very small size and high reliability which may be readily fabricated.

According to this invention, a monolithic semiconductor device is provided suitable for use as a phase shift oscillator comprising a unitary body of semiconductive material having a plurality of impurity doped regions to provide particular functions, namely, first and second impurity doped regions form with the bulk material of said unitary body an area providing transistor functions; a plurality of other impurity doped semiconductor regions which are continuous and integral with one of the first and second regions provide resistances to bias the transistor to a desired operating point upon the application of suitable potential thereto and another impurity doped region which is continuous and integral with one of the first and second regions provides a distributed resistance and is opposed on the opposite surface of the unitary body by a low resistance area of semiconductive material of opposite conductivity type to form a region providing the function of a distributed resistance-capacitance feedback network for providing phase shift in oscillation of the transistor area. In addition, oppositely doped regions are provided opposing each other to provide a coupling capacitor between the feedback network and the output of the device.

The present invention, together with the above mentioned and further objects and advantages thereof, may best be understood by reference to the following description, taken in connection with the accompanying drawing in which.

Figure 1:
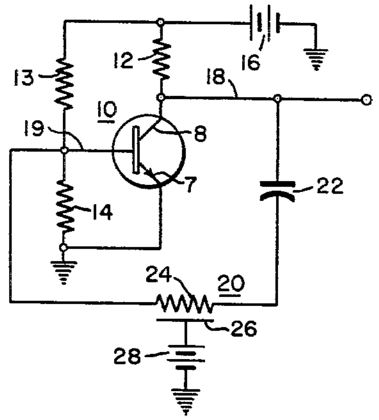
FIGURE 1 is a circuit diagram of a phase shift oscillator the function of which may be provided in accordance with the present invention within a monolithic device.

Referring now to FIG. 1 there is shown an oscillator circuit which is known in the art as a phase shift oscillator. A transistor 10 comprising an emitter lead 7, a collector lead 8 and a base lead 19 is shown coupled with bias resistors 12, 13 and 14 for placing the transistor 10 at a desired operating point upon application of a bias potential such as by means of a source of potential such as a battery 16. To provide oscillation, a feedback network 20 is connected into the output of the transistor 10 and to its base lead 19. The feedback network 20 comprises a coupling capacitor 22 which is in series with one side of a distributed resistance-capacitance (RC) network diagrammatically illustrated at 24 and 26. As is well known, the RC network generally comprises a semiconductor device having a distributed resistance 24, or a plurality of resistors, capacitively coupled to an equipotential surface 26. It is the potential applied by a variable potential source 28 to the equipotential surface 26, which determines the frequency at which oscillation takes place.

A notch filter, so called because of its sharp resonance peak, to provide the function of an RC network has been formed in semiconductive material and used in oscillator circuits of the type shown as is described in copending application Serial No. 5,001, filed January 27, 1960, entitled "Oscillators," by W. M. Kaufmann, and assigned to the same assignee as the present invention, now abandoned. However, no device providing the function of all the elements shown in the circuit of FIG. 1, excluding the sources of bias potential, has previously been provided in a monolithic device.

Referring to FIGS. 2 through 5, there is shown a unitary body of semiconductive material comprising a bulk material 30 extending throughout the major portions of the body and which may suitably be a semiconductive material having a resistivity of at least 50 ohm centimeters and which may vary up to 1000 ohm-cms. On the top surface of the unitary body there is a continuous region 32 comprising two main areas and an irregular end area of material of opposite conductivity type from the bulk material 30. For example, in the following discussion the bulk material 30 will be assumed to be slightly n-type (or nu type since in the preferred form of the invention its resistivity is relatively higher and doping level is relatively lower than materials ordinarily referred to as n-type) and the upper surface layer 32 is p-type. In one portion 34 of the p-type surface layer 32 there is formed an n-type region 36 so that the n-type region 36, that portion 34 of the p-type region 32 immediately adjacent the n-type region 36 and the portion of the bulk material 30 directly thereunder provide the necessary three regions and two junctions for junction transistor operation. In such case, the n-type region 36 serves the function of the emitter, the portion 34 of p-type surface layer 32 serves the function of the base and the bulk material 30 serves the function of the collector. More particularly, as a result of an n-type layer 50 formed on the bottom surface of the device, that is, a layer of the same conductivity type but more highly doped than the bulk material 30, the structure is analagous to an n-p-i-n transistor. A part of the base region 34 is provided with an ohmic contact 33 in order to improve the frequency response characteristic of the device by providing a low series resistance between the emitter and base.

Two arm-like regions 38 and 39 of the p-type surface layer 32 extend from that portion 34 serving as the transistor base and provide resistance equivalent to that of the bias resistors 13 and 14, shown in FIG. 1. A conductive path 37 extends from the n-type emitter 36 to a contact 40 which is grounded.

Connected with that part 34 of the p-type surface layer 32 which serves as a transistor base is portion 41 of large area and forming a large area p-n junction with the bulk material 30 and therefore provides a capacitive region by application of a suitable bias potential. This portion 41 of the surface layer provides the distributed resistance of the RC network as shown in FIG. 1.

Another and similarly large portion 42 of the p-type surface layer 32 extending from that which serves as the distributed resistance is disposed to form a large area diode with the bulk material 30 which when properly biased forms a capacitive region and serves the function of the coupling capacitor 22 shown in FIG. 1.

Figure 4:
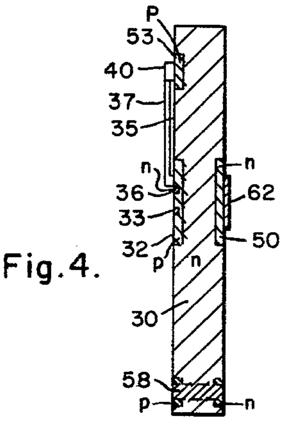
FIG. 4 is a cross sectional view taken along the line IV—IV of FIG. 2.
Figures 2, 3:
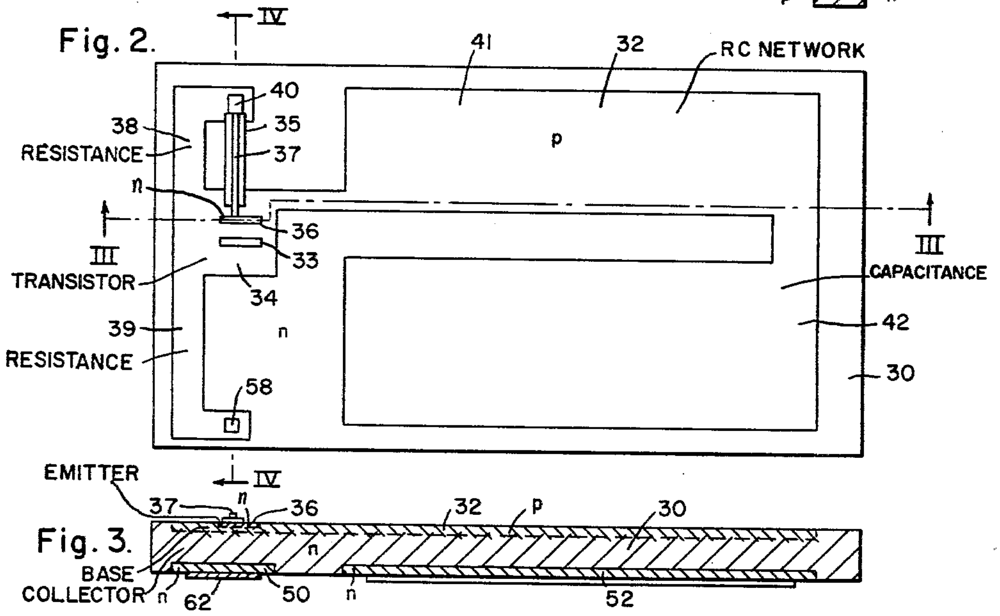
FIG. 2 is a top view of a monolithic semiconductor device providing the function of the circuit of FIG. 1.
FIG. 3 is a cross sectional view taken along the line III—III of FIG. 2.
Figure 5:
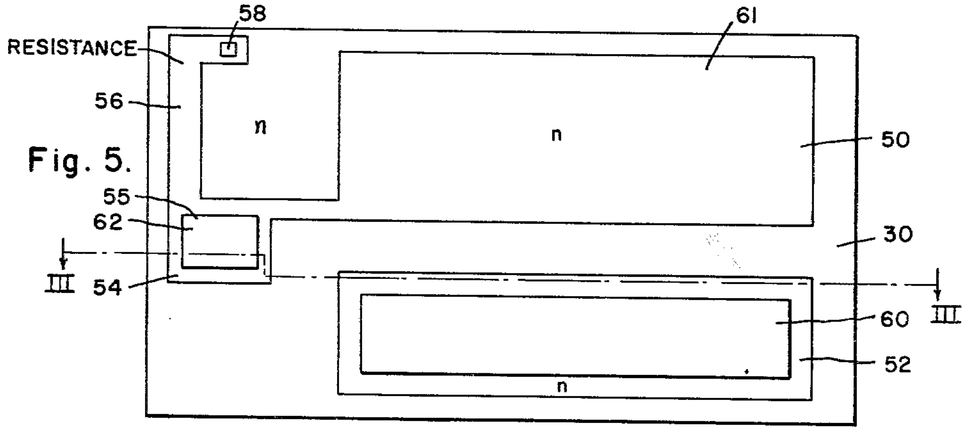
FIG. 5 is a bottom view of the device of FIGS. 2, 3, and 4.

On the bottom surface of the unitary body there is disposed a pattern of n-type material in two discrete layers 50 and 52 each formed as a result of diffusing additional n-type impurities into surface layers of the bulk material 30. Portion 54 of the layer 50 is disposed directly opposite the regions 34 and 36 on the upper surface that serve as the base and emitter, respectively of the transistor and has a metal film 55 thereon to provide for making an ohmic contact from which the output of the device is obtained. An arm 56 of the layer 50 extending from the portion 54 provides a resistive region serving as the other bias resistor 12 shown in FIG. 1. This latter resistive region formed by arm 56 and the second resistive region 39 on the upper surface each contact a point at which there is provided a low resistance path 58, which may be provided by a capacitor discharge therethrough, perpendicularly through the body of the material, as is illustrated in FIGURE 4 in particular, and it is to this point that a fixed bias potential is applied as in the equivalent circuit.

Disposed opposite that portion 42 of the upper surface layer 32 which serves as one side of the coupling capacitor is a portion 61 of the n-type lower surface layer 50. The highly doped (low resistivity) n-type regions 52 and 61 are introduced into the nu bulk material to provide a low resistance equipotential surface to provide a lower resistance path for carriers which flow to and from the storage regions of the inversely biased large area junction and, also, a narrower depletion region and consequently a larger capacitance per unit area of junction. The separate n-type surface layer 52 has a metallized film 60 thereon which provides a substantially equipotential surface for the RC network and it is to this region that a tuning bias is applied.

In the operation of the monolithic device of FIGS. 2 through 5 upon the bias being applied to the fixed bias point oscillations are established in conjunction with the distributed RC feedback network in the manner of the circuit of FIG. 1. Further information on the operation of this type of device and the functions which it performs may be learned by reference to the before mentioned copending application.

In the fabrication of a device as shown there is first obtained a wafer prepared by methods known to those skilled in the art, for example, a single crystal silicon rod may be pulled from a melt composed of silicon and at least one element from Group V of the Periodic Table such as arsenic, antimony or phosphorus. For a relatively high resistivity of about 100 ohm centimeters, the impurity level is adjusted to roughly $10^{16}$ atoms per cubic centimeter. A relatively high carrier lifetime in excess of 300 microseconds is also provided. The wafer is then cut from the rod in any suitable manner such as by use of a diamond saw. The cut surface of the wafer may then be lapped or etched or both in order to produce a smooth surface after sawing. Alternatively, the semiconductor device of this invention may be prepared from a section of a dendritic crystal prepared in accordance with copending application Serial No. 844,288, filed October 5, 1959, and assigned to the same assignee as the present invention, now Patent 3,031,403, issued April 24, 1962.

It will, of course, be understood that the material of the original wafer is that which makes up the bulk material 30 of the device shown in the drawing with the other regions being produced by subsequent processing operations upon the original wafer.

The size of the wafer from which fabrication starts depends on the desired frequency of operation. The filter area and the coupling capacitance area would necessarily be larger for a lower range of operating frequencies. The transistor area would be a function of the power rating of the oscillator as would be the area required for the biasing resistors.

For further reduction of surface resistance in both the n and p layers of the coupling capacitance, an evaporated metallic layer could be placed over these surfaces (without shorting junction edges) just like the layer 60 over the n region 52 of RC network. For an oscillator operating at frequencies of about 1 to 3 megacycles, and an output of 50 milliwatt, the block may have dimensions of 0.150 inch by 0.250 inch by 0.002 inch.

While it has been stated that the starting wafer may be of silicon, it is to be understood that other semiconductor materials may also be used such as germanium or a compound comprisesd of stoichometric portions of elements of Group III and Group V of the Periodic Table, for example, gallium arsenide, gallium antimonide, gallium phosphide, indium arsenide and indium antimonide. It will also be understood that the device may be fabricated so that the semiconductivity of the various regions is the reverse of that shown and described previously.

It is to be expressly understood that the device shown in the drawing may be fabricated by a number of processes involving either alloying techniques, diffusion techniques or both. As a preferred embodiment of the invention and merely by way of example, there is herein given as a specific example of a method of fabricating the semiconductor device a process which employs only diffusion operations to form the various doped semiconductive regions.

There is formed on the surface of the starting wafer an oxide surface layer having a thickness of about 5,000 Angstroms. This may be formed by heating the semiconductor body in an argon atmosphere containing water vapor at a temperature of about 1,000° C. Then the upper surface is coated with a photo-resist material which is then exposed through an optical mask so that the photo-resist material is removable in those areas which coincide with the portion of the upper surface on which the p-type surface layer 32 is to be formed.

After removal of the photo-resist coating in the appropriate pattern, a suitable etchant containing HF, is used to remove the exposed oxide layer so as to provide openings in the oxide surface layer exposing the semiconductive material. A suitable p-type impurity such as boron is then diffused into the wafer at the exposed portions by disposing the wafer in a diffusion furnace which has its hottest zone at a temperature of about 1100° C. to 1250° C. and has an atmosphere containing boron. It is preferred that boron be used for this purpose rather than other acceptor impurities since it has been found not to diffuse through the oxide surface layer as may be the case with other acceptor type impurities. The zone of the furnace within which a crucible containing the boron lies is at a suitable lower temperature being chosen to ensure the desired vapor pressure of boron from the crucible. Diffusion is continued for a time calculated to be sufficient to provide a surface concentration of about $10^{17}$ to $10^{18}$ atoms per cubic centimeter in a layer of about 0.0005 inch thick.

The entire semiconductor body is then again oxidized and by use of photo-resist material and an optical mask, openings are formed in the oxide layer on the bottom surface of the block and that portion of the top surface where location of the n-type emitter region is desired. In a similar manner as that in which the boron diffusion is carried out, diffusion of a suitable donor type impurity such as phosphorus is then performed into those exposed regions until a surface concentration of about $10^{21}$ atoms per cubic centimeter with a depth of 0.004 inch is provided.

In the foregoing diffusion operations, it is preferable that during each diffusion water vapor be available in the diffusant so that an oxide layer is simultaneously produced with the diffusion of the impurity into the wafer. Then after the second diffusion, the oxide layer is removed by etching after exposure through a suitable optical mask of a photo-resist coating in those areas where external ohmic contacts are to be made. These regions include the ground point 40, the fixed biased point 58, the tuning biasing area 60, the output area 62 and also the emitter area 36 and the base contact 33 in close proximity to the emitter 36. Then, after removal of the oxide layer at these exposed areas, evaporated metal is deposited in these regions, a suitable metal being aluminum, gold or silver. At the same time, a conductive path 37 is formed running over the oxide layer 35 from the ground point 40 to the emitter 36. It should be noted that in removing the oxide layer for performing the metallizing operation, it is essential that no oxide covering a diffusion region edge should be disturbed because it is desirable that the oxide layer remain for protection from shorting by the metallizing layer or from exposure to the atmosphere.

Small diameter lead wires (not shown) having a diameter of about 2 mils are bonded to the metallized regions to form external connections to the block.

In order to provide the low resistance path through the block at the fixed biased point 58, there may be employed the method involving a capacitor discharge between metallized surfaces on opposite sides of the block to breakdown the semiconductive material and make it substantially conductive. This technique is described in copending application Serial No. 38,051, filed June 22, 1960, by J. P. Stelmak, and assigned to the same assignee as the present invention.

In order to permit the use of a thicker semiconductor body such as about 5 mils rather than 2 mils in order to minimize breakage during handling, it is possible to reduce the wafer thickness in certain portions of the block prior to any diffusion so that proper transistor and capacitance parameters may be maintained.

While the present invention has been shown and described in certain forms only, it will be obvious to those skilled in the art that it is not so limited, but is susceptible of various changes and modifications without departing from the spirit and scope thereof.

We claim as our invention:

1. A monolithic semiconductor device suitable for use as a phase shift oscillator comprising: a unitary body of semiconductive material of a bulk material having a resistivity of at least 50 ohm centimeters and a carrier lifetime of at least 300 microseconds and being of a first type semiconductivity; said unitary body having in a first portion thereof a first and a second impurity doped semiconductive region to form with said bulk material three semiconductive regions of alternate conductivity type separated by p-n junctions and providing transistor functions; a plurality of other impurity doped semiconductive regions continuous and integral with one of said first and second regions for providing resistances to bias said transistor area to a desired operating point upon application of suitable potential thereto; first and second additional impurity doped semiconductive regions continuous and integral with said first semiconductive region, said first additional region opposed on the opposite surface of said unitary body by a low resistance portion to form an area providing the function of a distributed resistance-capacitance network and said second additional region opposed on the opposite surface of said unitary body by a region of opposite conductivity type to provide a capacitive function upon the application of a reverse bias thereto.

2. A monolithic semiconductor oscillator comprising: a thin unitary body of semiconductive material having opposing major surfaces and having a bulk material of a first type semiconductivity with a resistivity of at least about 50 ohm centimeters and a carrier lifetime of at least about 300 microseconds; a continuous first diffused layer of a second type semiconductivity in a predetermined pattern on one of said major surfaces forming a first p-n junction with said bulk material; second and third diffused layers of said first type semiconductivity in a predetermined pattern on the other of said major surfaces making ohmic contact with said bulk material; a fourth diffused layer of said first type semiconductivity disposed on a first portion of said first diffused layer and forming a second p-n junction therewith; a transistor area thereby being formed wherein said fourth diffused layer in the emitter region, said first portion of said first diffused layer is the base region, a first portion of said second diffused layer opposite to said first portion of said first diffused layer is the collector region and the bulk material therebetween acts as an intrinsic region; an elongated second portion of said first diffused layer extending from said base region to a first ohmic contact, said second portion providing a first resistive portion, an oxide layer extending over said first major surface between said first ohmic contact and said emitter region, a conductive layer on said oxide layer and connecting said first ohmic contact and said emitter region; an elongated third portion of said first diffused layer extending from said base region to a second ohmic contact, said third portion providing a second resistive portion, said second ohmic contact connected by a low resistance conductive path through said bulk material to a third ohmic contact on said other major surface; an elongated second portion of said second diffused layer extending from said collector region to said third ohmic contact and forming a third resistive portion; said first, second and third resistive portions providing, upon the application of bias potential, bias resistances respectively between the base region and emitter region, between the base region and said low resistance conductive path and between the collector region and said low resistance conductive path; a fourth portion of said first diffused layer extending from said base region and having a large area relative thereto, said third diffused layer on said opposite major surface opposing said fourth portion of said first diffused layer and forming therewith a distributed resistance-capacitance network wherein said fourth portion of said first diffused layer is a resistive portion capacitively coupled to said third diffused layer upon application of a suitable potential thereto to reverse bias said first p-n junction therebetween; a fifth portion of said first diffused layer connected by a narrow region to said fourth portion and haivng a large area relative to said base region, a third portion of said second diffused layer on said opposing major surface opposing said fifth portion of said first diffused layer and forming therewith a capacitive region upon application of bias potential thereto to reverse bias said first p-n junction therebetween; means to derive an oscillatory output signal from a point on said second diffused layer.

3. A monolithic semiconductor oscillator comprising: a unitary body of semiconductive material; said unitary body having a bulk material extending throughout and making up the major portion thereof and having in a first portion thereof at least a first and a second impurity doped semiconductive region to form with said bulk material an area providing transistor functions; a plurality of other impurity doped semiconductive regions each continuous and integral with one of the impurity doped semiconductive regions in said transistor area for providing resistances to bias said transistor area to a desired operating point upon application of a suitable potential thereto; and another impurity doped semiconductive region continuous and integral with one of said first and second regions and opposed on the opposite surface of said unitary body by a low resistance portion to form an area providing the function of a distributed resistance-capacitance feedback network; a source of fixed bias potential having one terminal thereof applied to an extremity of at least two of said resistance regions to place said transistor area at a desired operating point; a source of variable bias potential having one terminal thereof applied to said low resistance portion of said area providing the function of a distributed resistance-capacitance feedback network for varying capacitance values in said network and thereby the resonant frequency thereof; means to derive an oscillatory output signal from a region of said transistor area.

References Cited in the file of this patent

UNITED STATES PATENTS 2,816,228 Johnson ______________ Dec. 10, 1957

OTHER REFERENCES

Article by Kilby in Electronics, August 7, 1959, pp. 110, 111.

Article by Lathrop in Electronics, May 13, 1960, pp. 69 to 78.